(12) United States Patent
Chu et al.

(10) Patent No.: US 6,217,724 B1
(45) Date of Patent: *Apr. 17, 2001

(54) COATED PLATEN DESIGN FOR PLASMA IMMERSION ION IMPLANTATION

(75) Inventors: Paul K. Chu, Kowloon (HK); Chung Chan, Newton, MA (US)

(73) Assignee: Silicon General Corporation, Campbell, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/215,094

(22) Filed: Dec. 18, 1998

Related U.S. Application Data

(60) Provisional application No. 60/074,397, filed on Feb. 11, 1998.

(51) Int. Cl.[7] .................................................. C23C 14/50
(52) U.S. Cl. .................. 204/192.37; 204/192.32; 204/298.32; 204/298.36; 204/298.15; 118/723 I; 118/723 IR; 118/723 MP; 118/728; 118/733; 427/523; 427/524; 427/527; 156/345
(58) Field of Search ........................... 118/723 I, 723 IR, 118/723 MP, 728, 733; 427/523, 524, 527; 204/192.32, 192.37, 298.32, 298.36, 298.15; 156/345

(56) References Cited

U.S. PATENT DOCUMENTS

| | | | | |
|---|---|---|---|---|
| 4,579,609 | * | 4/1986 | Reif et al. | 117/97 |
| 5,134,301 | * | 7/1992 | Kamata et al. | 250/492.2 |
| 5,292,393 | * | 3/1994 | Maydan et al. | 156/345 |
| 5,653,811 | * | 8/1997 | Chan | 118/723 I |
| 5,654,043 | * | 8/1997 | Shao et al. | 427/527 |
| 6,028,285 | * | 2/2000 | Khater et al. | 219/121.43 |
| 6,120,660 | * | 9/2000 | Chu et al. | 204/298.15 |

* cited by examiner

*Primary Examiner*—Rodney McDonald
(74) *Attorney, Agent, or Firm*—Townsend and Townsend and Crew LLP

(57) ABSTRACT

A plasma treatment system (200) for implantation with a novel susceptor with a silicon coating (203). The system (200) has a variety of elements such as a chamber, which can have a silicon coating formed thereon, in which a plasma is generated in the chamber. The system (200) also has a susceptor disposed in the chamber to support a silicon substrate. The silicon coating reduces non-silicon impurities that may attach to the silicon substrate. In a specific embodiment, the chamber has a plurality of substantially planar rf transparent windows (26) on a surface of the chamber. The system (200) also has an rf generator (66) and at least two rf sources in other embodiments.

18 Claims, 13 Drawing Sheets

COATED PLATEN DESIGN FOR PLASMA IMMERSION ION IMPLANTATION

CROSS REFERENCES TO RELATED APPLICATIONS

The present patent application claims priority to U.S. Provisional Patent Application Ser. No. 60/074,397 filed Feb. 11, 1998, which is hereby incorporated by reference for all purposes.

The following two commonly-owned copending applications, including this one, are being filed concurrently and the other one is hereby incorporated by reference in its entirety for all purposes:

1. U.S. patent application Ser. No. 09/215,094, allowed Chu et al., entitled, "Coated Platen Design For Plasma Immersion Ion Implantation,"; and 2. U.S. patent application Ser. No. 09/216,035, now U.S. Pat. No. 6,120,660 Chu et al., entitled, "Removable Liner Design For Plasma Immersion Ion Implantation".

BACKGROUND OF THE INVENTION

The present invention relates to the manufacture of integrated circuits. More particularly, the present invention provides a technique for selectively controlling a distribution of impurities that are implanted using a plasma immersion ion implantation or plasma ion source system for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs. Some integrated circuits are fabricated on a slice or wafer, of single-crystal (monocrystalline) silicon, commonly termed a "bulk" silicon wafer. Devices on such "bulk" silicon wafer typically use processing techniques such as ion implantation or the like to introduce impurities or ions into the substrate. These impurities or ions are introduced into the substrate to selectively change the electrical characteristics of the substrate, and therefore devices being formed on the substrate. Ion implantation provides accurate placement of impurities or ions into the substrate. Ion implantation, however, is expensive and generally cannot be used effectively for introducing impurities into a larger substrate such as glass or a semiconductor substrate, which is used for the manufacture of flat panel displays or the like.

Accordingly, plasma treatment of large area substrates such as glass or semiconductor substrates has been proposed or used in the fabrication of flat panel displays or 300 mm silicon wafers. Plasma treatment is commonly called plasma immersion ion implantation ("PIII") or plasma source ion implantation ("PSI"). Plasma treatment generally uses a chamber, which has an inductively coupled plasma source, for generating and maintaining a plasma therein. A large voltage differential between the plasma and the substrate to be implanted accelerates impurities or ions from the plasma into the surface or depth of the substrate. A variety of limitations exist with the convention plasma processing techniques.

A major limitation with conventional plasma processing techniques is the maintenance of the uniformity of the plasma density and chemistry over such a large area is often difficult. As merely an example, inductively or transformer coupled plasma sources ("ICP" and "TCP," respectively) are affected both by difficulties of maintaining plasma uniformity using inductive coil antenna designs. Additionally, these sources are often costly and generally difficult to maintain, in part, because such sources which require large and thick quartz windows for coupling the antenna radiation into the processing chamber. The thick quartz windows often cause an increase in rf power (or reduction in efficiency) due to heat dissipation within the window.

Other techniques such as Electron Cyclotron Resonance ("ECR") and Helicon type sources are limited by the difficulty in scaling the resonant magnetic field to large areas when a single antenna or waveguide is used. Furthermore, most ECR sources utilize microwave power which is more expensive and difficult to tune electrically. Hot cathode plasma sources have been used or proposed. The hot cathode plasma sources often produce contamination of the plasma environment due to the evaporation of cathode material. Alternatively, cold cathode sources have also be used or proposed. These cold cathode sources often produce contamination due to exposure of the cold cathode to the plasma generated.

A pioneering technique has been developed to improve or, perhaps, even replace these conventional sources for implantation of impurities. This technique has been developed by Chung Chan of Waban Technology in Massachusetts, now Silicon Genesis Corporation, and has been described in U.S. Pat. No. 5,653,811 ("Chan"), which is hereby incorporated by reference herein for all purposes. Chan generally describes techniques for treating a substrate with a plasma with an improved plasma processing system. The improved plasma processing system, includes, among other elements, at least two rf sources, which are operative to generate a plasma in a vacuum chamber. By way of the multiple sources, the improved plasma system provides a more uniform plasma distribution during implantation, for example. It is still desirable, however, to provide even a more uniform plasma for the manufacture of substrates. Additionally, Chan's techniques can create particulate contamination during implantation processes using his plasma processing system.

From the above, it is seen that an improved technique for introducing impurities into a substrate is highly desired.

SUMMARY OF THE INVENTION

According to the present invention, a technique including a method and system for introducing impurities into a substrate using plasma immersion ion implantation is provided. In an exemplary embodiment, the present invention provides system with a novel susceptor with a coating that reduces particulate contamination that may attach to a substrate surface during an implantation process.

In a specific embodiment, the present invention provides a plasma treatment system for implantation with a novel susceptor with a coating thereon. The system has a variety of elements such as a chamber in which a plasma is generated in the chamber. The system also has a susceptor disposed in the chamber to support a substrate such as a silicon substrate. A silicon bearing compound is coated on the susceptor for reducing impurities or non-silicon materials that may sputter off of the susceptor. In a specific embodiment, the chamber has a plurality of substantially planar rf transparent windows on a surface of the chamber. The system also has an rf generator and at least two rf sources in other embodiments. A silicon bearing compound is coated onto the interior surfaces of the chamber. This coating reduces impurities or non-silicon materials that may sputter off of the interior surfaces of the chamber during plasma immersion ion implantation.

In an alternative embodiment, the present invention provides a method for forming a substrate using a plasma immersion ion implantation system. The method includes a step of providing a silicon substrate, which has a surface, onto a susceptor within a plasma immersion ion implantation chamber. The method then introduces and/or accelerates particles in a uniform, directional manner toward and into the surface to uniformly place the ions into a selected depth across a plane of the substrate. During the introducing step, the method sputters silicon bearing compounds off of interior chamber surfaces and portions of the susceptor. These silicon bearing compounds do not detrimentally influence the implantation process and reduce a possibility of introducing any impurities or non-silicon bearing compounds that can attach to the silicon substrate surface.

Numerous advantages are achieved by way of the present invention over conventional techniques. For example, the present invention provides a relatively easy to implement device for improving implantation uniformity across a substrate such as a wafer in a specific embodiment. In some embodiments, the present invention provides a system that produces fewer non-silicon particles (e.g., aluminum, iron, chrome, nickel) that may introduce defects into a substrate, for example. In still other embodiments, the present invention can be implemented into conventional PIII systems using kits or tools to provide the novel silicon coatings. Accordingly, the present invention is generally cost effective and easy to implement. These and other advantages or benefits are described throughout the present specification and are described more particularly below.

These and other embodiments of the present invention, as well as its advantages and features are described in more detail in conjunction with the text below and attached Figs.

DESCRIPTION OF SPECIFIC EMBODIMENTS

The present invention provides an improved plasma immersion ion implantation system. In an exemplary embodiment, the present invention provides an improved pedestal (or susceptor) for securing a wafer during implantation. Additionally, the present invention provides a silicon coating on interior surfaces of a chamber for reducing non-silicon impurities that can attach to a silicon wafer surface. This improved pedestal and silicon coating reduce provide fewer sputtered contamination, which can be deposited on a surface of a substrate to be processed. By way of less contamination, the present system provides improved substrates and the like.

1. Conventional Plasma Processing System

Figure 1:
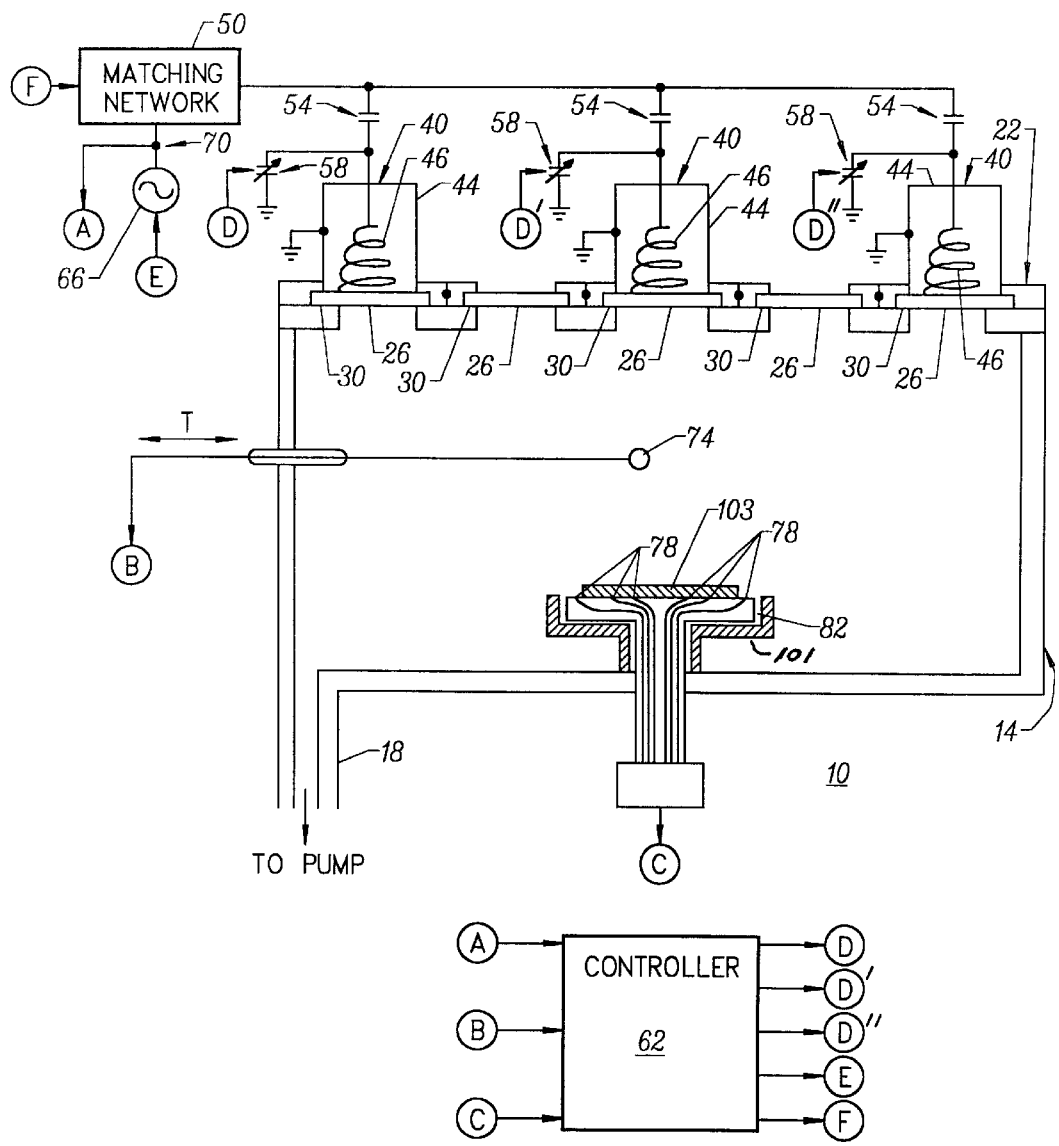
FIG. 1 is a simplified block diagram of a conventional plasma treatment system.

In brief overview and referring to FIG. 1, conventional plasma processing system 10 includes a vacuum chamber 14 having a vacuum port 18 connected to a vacuum pump (not shown). The system 10 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in a system having a helical or pancake antennae 46 located within an outer shield/ground 44. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 10 being removed. Although glass windows are used, other dielectric material such as quartz or polyethylene may be used for the window material.

Each antenna 46 is connected to an rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 62. By individually adjusting the tuning capacitors 85, the output power from each rf antenna 46 can be adjusted to maintain the uniformity of the plasma generated. Other tuning means such as zero reflective power tuning may also be used to adjust the power to the antennae. The rf generator 66 is controlled by a signal E from the controller 62. The controller 62 controls the power to the antennae 46 by a signal F to the matching network 50.

The controller 62 adjusts the tuning capacitors 58 and the rf generator 66 in response to a signal A from a sensor 70 monitoring the power delivered to the antennae 46, a signal B from a fast scanning Langmuir probe 74 directly measuring the plasma density and a signal C from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 10 to plasma treat a substrate. Once the settings are determined, the probes are removed and the wafer to be treated is introduced. The probes are left in place during processing to permit real time control of the system. Care must be taken to not contaminate the plasma with particles evaporating from the probe and to not shadow the substrate being processed.

Figure 1A:
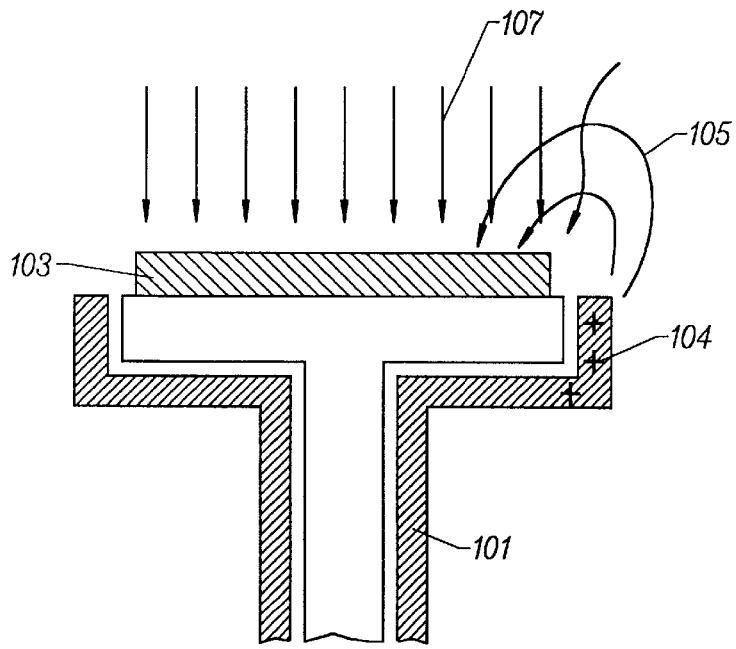
Figure 1B:
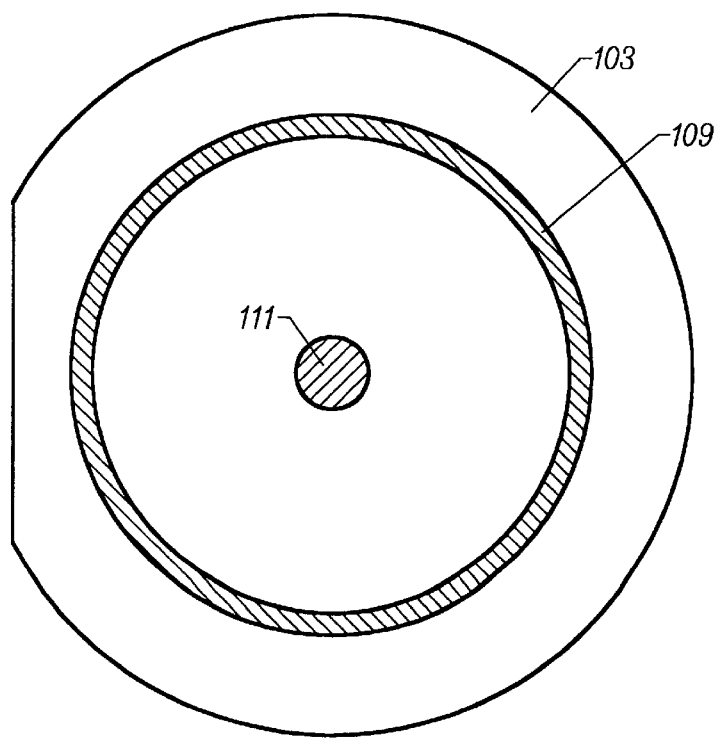

This conventional system has numerous limitations. For example, the conventional system 10 includes wafer holder 82 that is surrounded by a quartz liner 101. The quartz liner is intended to reduce unintentional contaminants sputtered from the sample stage to impinge or come in contact with the substrate 103, which should be kept substantially free from contaminates. Additionally, the quartz liner is intended to reduce current load on the high voltage modulator and power supply. The quartz liner, however, often attracts impurities or ions 104 that attach themselves to the quartz liner by way of charging, as shown by FIG. 1A. By way of this attachment, the quartz liner becomes charged, which changes the path of ions 105 from a normal trajectory 107. The change in path can cause non-uniformities during a plasma immersion implantation process. FIG. 1B shows a simplified top-view diagram of substrate 103 that has high concentration regions 111 and 109, which indicate non-uniformity. In some conventional systems, the liner can also be made of a material such as aluminum. Aluminum is problematic in conventional processing since aluminum particles can sputter off of the liner and attach themselves to the substrate. Aluminum particles on the substrate can cause a variety of functional and reliability problems in devices that are manufactured on the substrate. A wafer stage made of stainless steel can introduce particulate contamination such as iron, chromium, nickel, and others to the substrate. A paper authored by Zhineng Fan, Paul K. Chu, Chung Chan, and Nathan W. Cheung, entitled "Dose and Energy Non-Uniformity Caused By Focusing Effects During Plasma Immersion Ion Implantation," published in Applied Physics Letters in 1998 describes some of the limitations mentioned herein.

In addition to the limitations noted above for the susceptor, numerous limitations can also exist with the chamber. For example, commonly used materials for the chamber include, among others, stainless steel or aluminum. These materials often sputter off the interior surfaces of the chamber and redeposit onto surfaces of a substrate, which is being processed. The presence of these types of materials often places non-silicon bearing impurities onto the surface of a silicon wafer, for example. These impurities can lead to functional, as well as reliability problems, with integrated circuit devices that are fabricated on the silicon substrate. Accordingly, conventional chambers also have severe limitations with conventional plasma immersion implantation systems.

2. Present Plasma Immersion Systems

Figure 2:
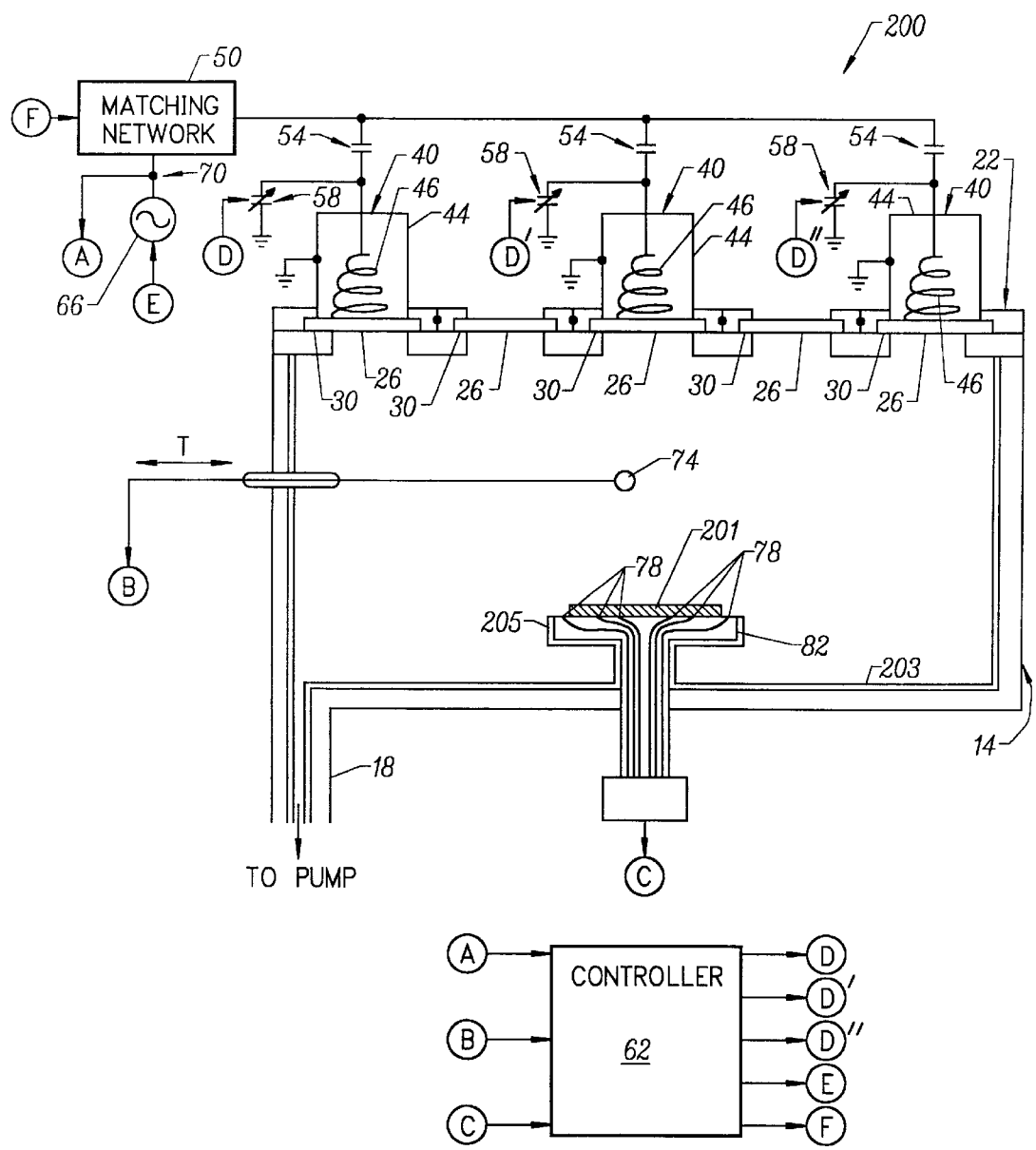
FIGS. 2–8 are simplified diagrams of plasma treatment systems according to embodiments of the present invention

FIG. 2 is a simplified overview of a plasma treatment system 200 for implanting impurities according to an embodiment of the present invention. This diagram is merely and illustration and should not limit the scope of the claims herein. One of ordinary skill in the art would recognize other variations, modifications, and alternatives. For easy reading, some of the reference numerals used in FIG. 1 are used in FIG. 2 and others. In a specific embodiment, system 200 includes a vacuum chamber 14 having a vacuum port 18 connected to a vacuum pump (not shown). The system 10 includes a series of dielectric windows 26 vacuum sealed by o-rings 30 and attached by removable clamps 34 to the upper surface 22 of the vacuum chamber 14. Removably attached to some of these dielectric windows 26 are rf plasma sources 40, in one embodiment having a helical or pancake antennae 46 located within an outer shield/ground 44. Other embodiments of the antennae using capacitive or inductive coupling may be used. Cooling of each antenna is accomplished by passing a cooling fluid through the antenna. Cooling is typically required only at higher power. The windows 26 without attached rf plasma sources 40 are usable as viewing ports into the chamber 14. The removability of each plasma source 40 permits the associated dielectric window 26 to be cleaned or the plasma source 40 replaced without the vacuum within the system 10 being removed. Although glass windows are used in this embodiment, other dielectric material such as quartz or polyethylene may be used for the window material.

Each antenna 46 is connected to a rf generator 66 through a matching network 50, through a coupling capacitor 54. Each antenna 46 also includes a tuning capacitor 58 connected in parallel with its respective antenna 46. Each of the tuning capacitors 58 is controlled by a signal D, D', D" from a controller 62. By individually adjusting the tuning capacitors 85, the output power from each rf antenna 46 can be adjusted to maintain the uniformity of the plasma generated. Other tuning means such as zero reflective power tuning may also be used to adjust the power to the antennae. In one embodiment, the rf generator 66 is controlled by a signal E from the controller 62. In one embodiment, the controller 62 controls the power to the antennae 46 by a signal F to the matching network 50.

The controller 62 adjusts the tuning capacitors 58 and the rf generator 66 in response to a signal A from a sensor 70 (such as a Real Power Monitor by Comdel, Inc., Beverly, Mass.) monitoring the power delivered to the antennae 46, a signal B from a fast scanning Langmuir probe 74 directly measuring the plasma density and a signal C from a plurality of Faraday cups 78 attached to a substrate wafer holder 82. The Langmuir probe 74 is scanned by moving the probe (double arrow I) into and out of the plasma. With these sensors, the settings for the rf generator 66 and the tuning capacitors 58 may be determined by the controller prior to the actual use of the system 10 to plasma treat a substrate. Once the settings are determined, the probes are removed and the wafer to be treated is introduced. In another embodiment of the system, the probes are left in place during processing to permit real time control of the system. In such an embodiment using a Langmuir probe, care must be taken to not contaminate the plasma with particles evaporating from the probe and to not shadow the substrate being processed. In yet another embodiment of the system, the characteristics of the system are determined at manufacture and the system does not include plasma probe.

Figure 2A:
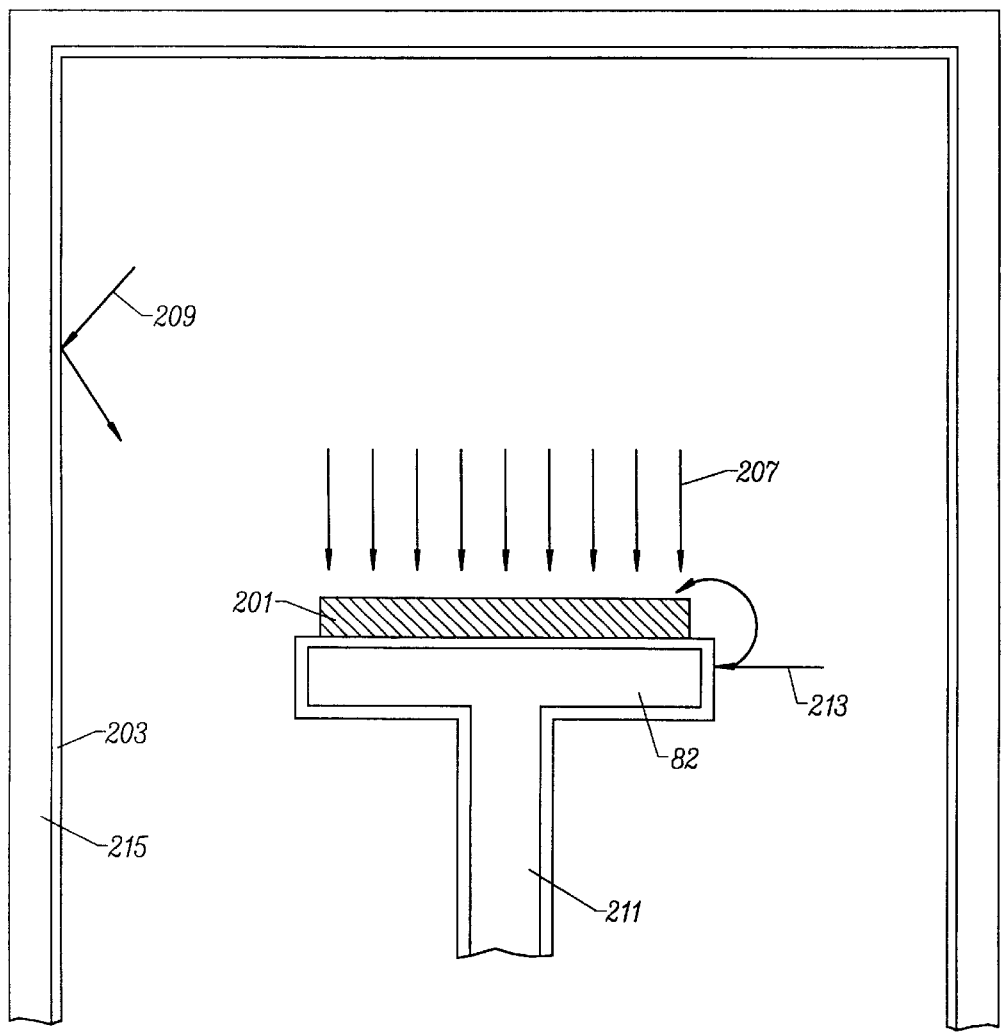

In a specific embodiment, the present system includes a novel susceptor design 82 using a silicon coating 205. The silicon coating 205 is defined on substantially all surfaces, including top, sides, and bottom, of the susceptor 82, which holds silicon wafer 201. The silicon coating includes a silicon bearing compound. In most embodiments, the silicon coating is desirable in a process using silicon wafers or the like. The coating can be made of any suitable material that is sufficiently resistant to implantation and temperature influences. As merely an example, the silicon coating can be an amorphous silicon layer, a crystalline silicon, or a polysilicon thickness for providing protection or isolating the base susceptor material 211, as shown in FIG. 2A, for example. The silicon coating can be applied to the susceptor using a variety of deposition techniques such as chemical vapor deposition, physical vapor deposition, and others. The base susceptor material can be a variety of materials such as stainless steel, aluminum, and others. Accordingly, an ion 213 impinging on susceptor coating 205 can remove a silicon bearing compound that is deposited on substrate 201. Since the coating is made of the same or similar material as the silicon substrate 201, substantially no damage occurs to the substrate during implantation of ions 207. The silicon coating is often about 0.5 micrometers to about 2.0 micrometers or thicker, depending upon the embodiment.

In another embodiment, the present invention also includes a silicon coating 203 that is defined on the interior surfaces of the chamber. The silicon coating includes a silicon bearing compound. In most embodiments, the silicon coating is desirable in a process using silicon wafers or the like. The coating can be made of any suitable material that is sufficiently resistant to implantation and temperature influences. The silicon coating can be applied to the susceptor using a variety of deposition techniques such as chemical vapor deposition, physical vapor deposition, and others. As merely an example, the silicon coating can be an amorphous silicon layer, a crystalline silicon, or a polysilicon thickness for providing protection or isolating the base chamber material 215. The silicon coating is often about 0.5 micrometers to about 2.0 micrometers or thicker, depending upon the embodiment. The base chamber material can be a variety of materials such as stainless steel, aluminum, and others. Accordingly, an ion 209 impinging on silicon coating 203 can remove a silicon bearing compound from the coating that is deposited on substrate 201. Since the coating is made of the same or similar material as the silicon substrate 201, substantially no damage occurs to the substrate during implantation of ions 207.

Figure 2B:
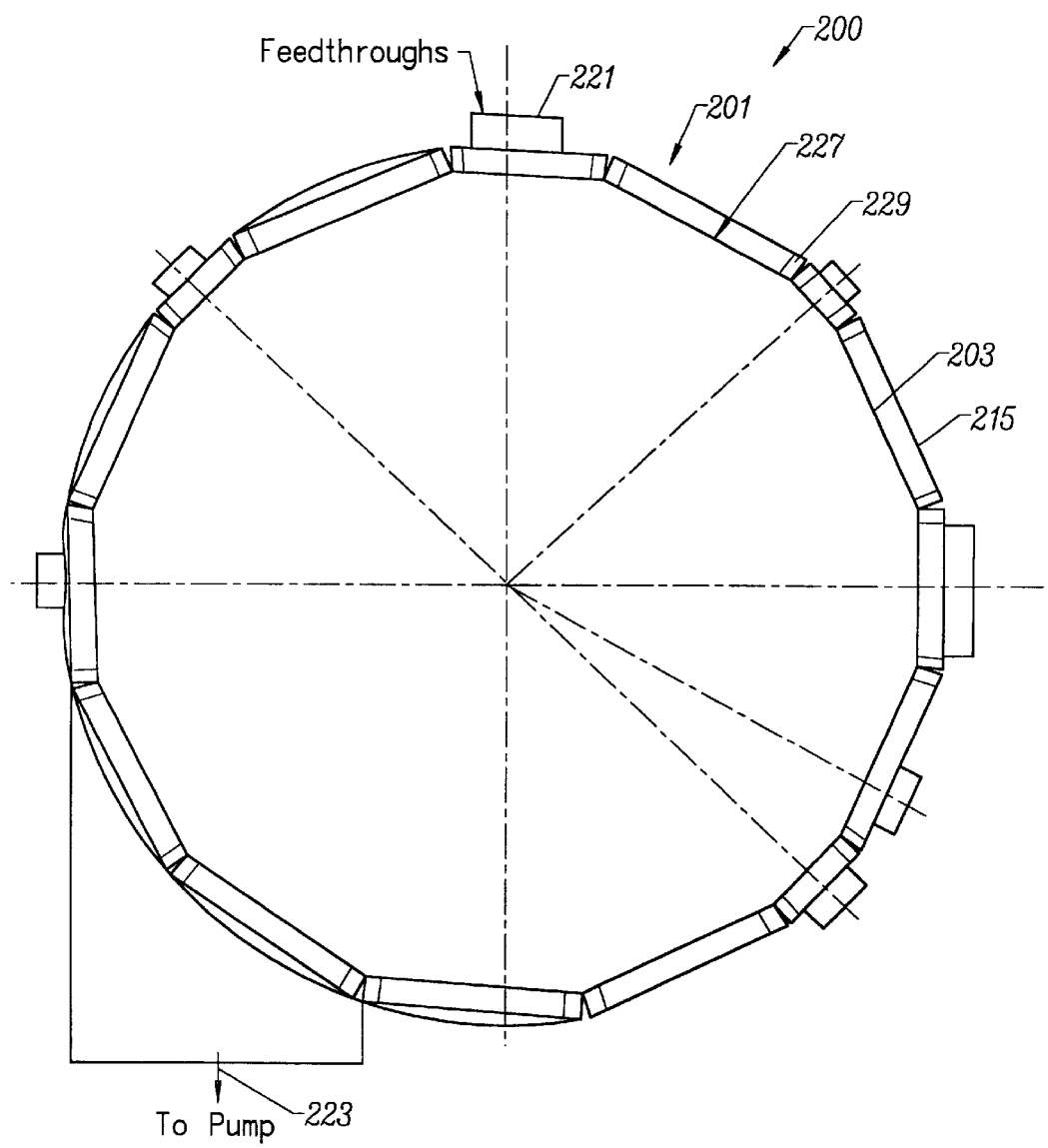

In an alternative embodiment, the interior chamber coating can be formed using a silicon liner material. FIG. 2B is a simplified top-view diagram of system 200 having a silicon liner according to the present invention. The system shows a variety of elements such as base chamber material 215 and silicon coating 203 or liner that is defined on the base chamber material. Additionally, the system includes a feed location 221 and an exhaust location 223. In this specific embodiment, the system includes chamber walls that are made of panels 225, which are circularly shaped (i.e., polygon) to form a cylindrically shaped liner. The panels are attached to each other using fasteners or welded together. Each panel is made of a plurality of flat silicon substrates 227, which are each housed in a frame 229. The silicon substrates can be in the form of square wafers and the frame can be made of stainless steel or the like.

Figure 2C:
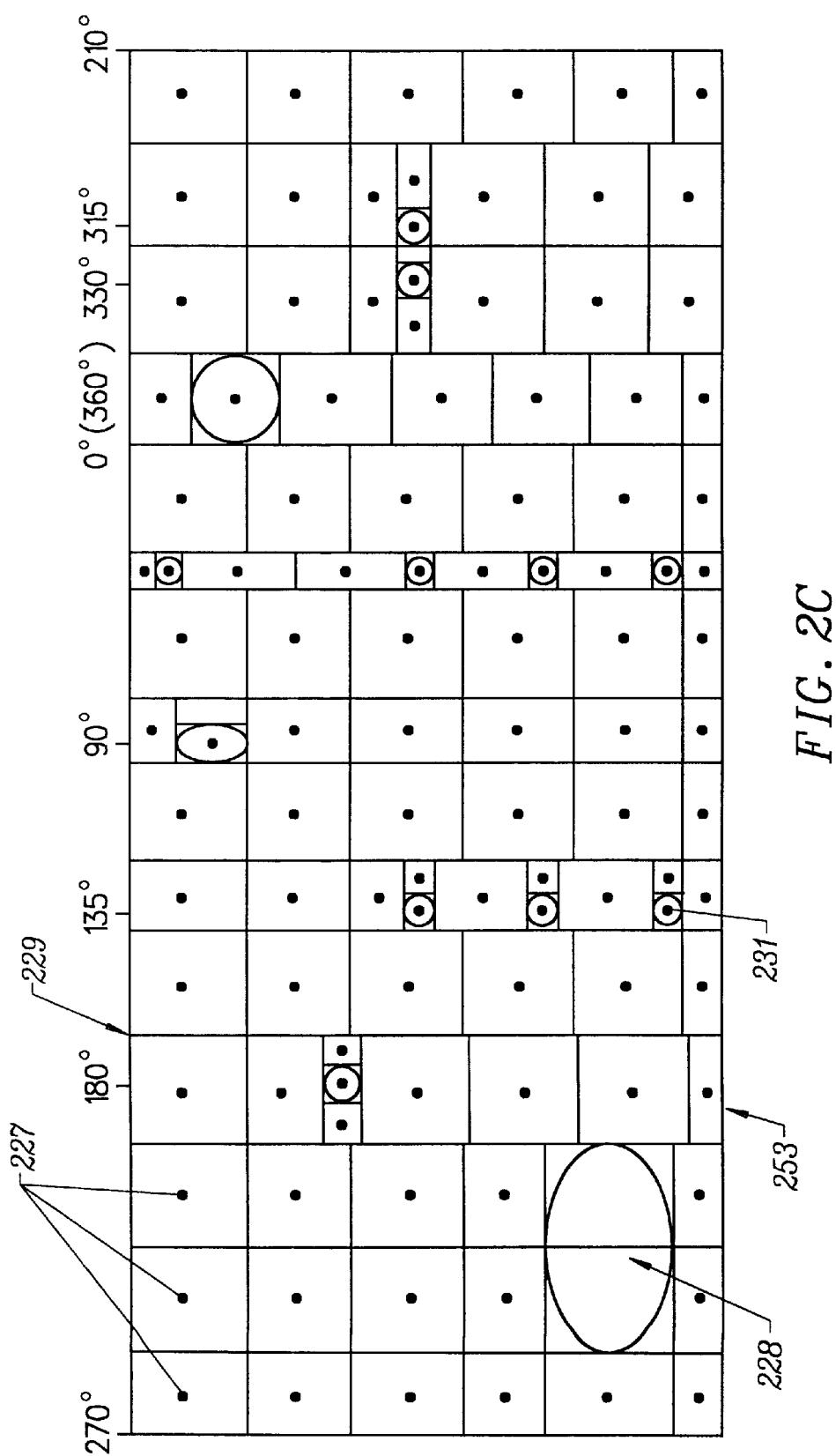
Figure 2D:
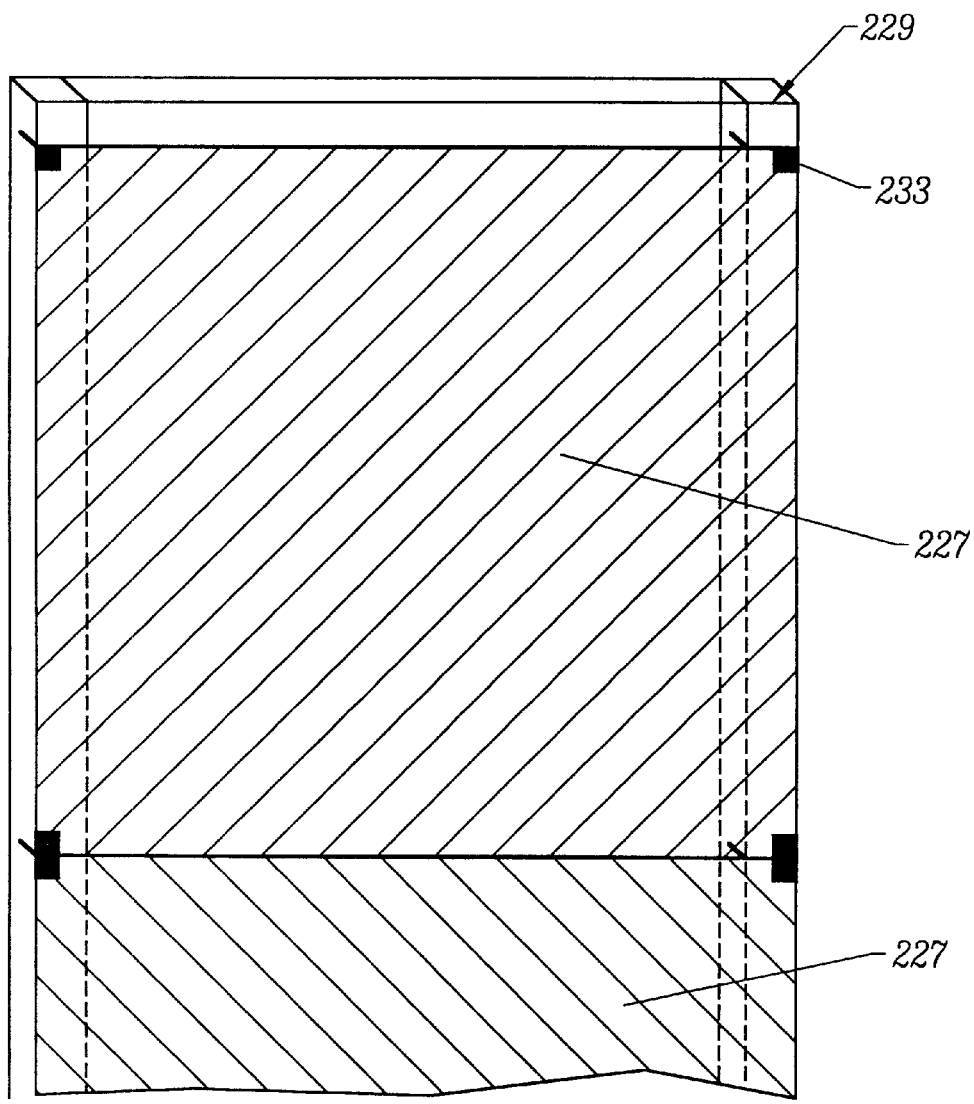

FIGS. 2C and 2D are simplified side-view diagrams of an expanded chamber sidewall or liner according to embodiments of the present invention. The expanded chamber sidewall illustrates a plurality of silicon substrates 227, which are grouped together to form panels 253. The panels run parallel to each other and are folded in a manner to form the cylindrically shaped liner. Each of the substrates is housed or disposed in stainless steel frame 229 and aligned vertically to form the panel. The frame runs in horizontal and vertical sections, which are normal to each other for strength and design. The chamber sidewall also includes openings 228 and 231 for facilities or chamber elements, e.g., sensors. Each substrate is housed in frame 229, which is covered by the substrate. That is, the frame is not exposed to the interior of the chamber. A stainless steel clip 233 holds or secures each of substrate into the frame. The clip generally uses friction forces to secure the clip into the frame, which holds the substrate. In this embodiment, a portion of the stainless steel clip is exposed to the interior of the chamber.

Figure 2E:
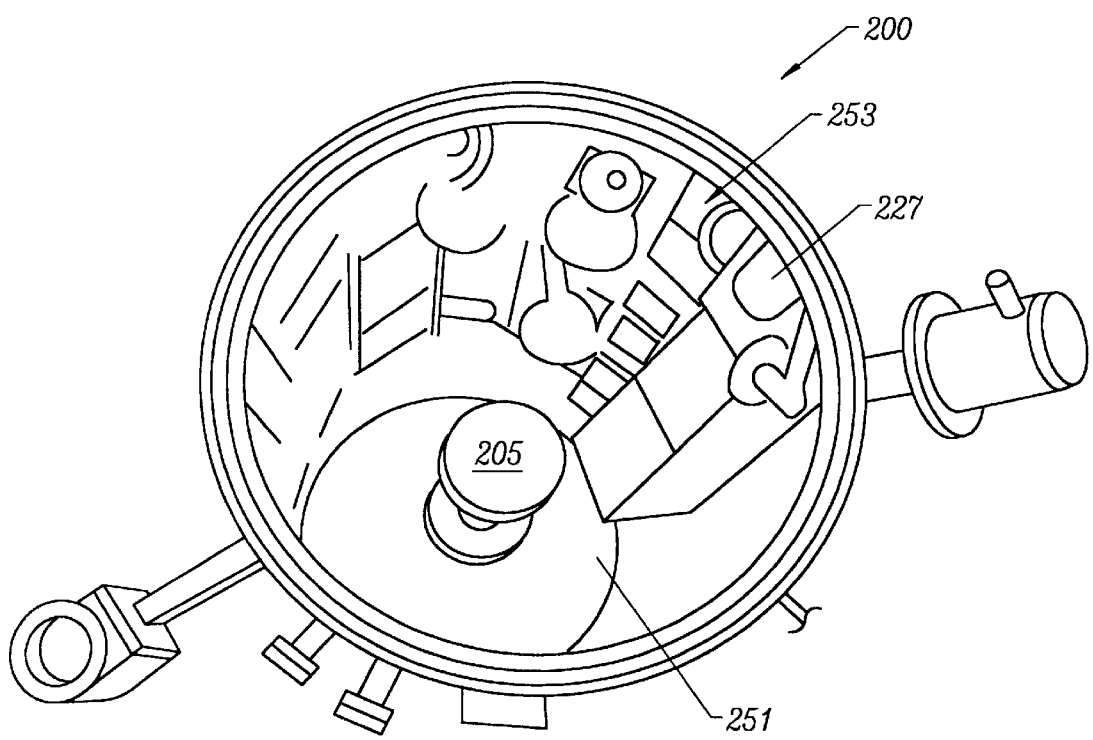

FIG. 2E is an expanded top-view diagram of a chamber, having the silicon coating and liner, according to embodiments of the present invention. The chamber includes a variety of elements such as panel 253, which is made of the plurality of silicon substrates 227. The susceptor is coated 205 also with silicon. A bottom region 251 of the chamber, which underlies the susceptor, is also lined with silicon. As shown, the panels are attached to each other to form a cylindrical liner. The cylindrical liner lines the interior periphery of the chamber to provide "walls" for the chamber. A bottom portion of the housing sits on the bottom region 251. A top portion of the housing faces a chamber top that holds the inductive coils. Most of the interior surfaces of the chamber are lined with silicon material, including the silicon coating, silicon liner, and others. In a specific embodiment, the interior surfaces are at least 70% silicon or at least 90% silicon, but are not limited to these percentages.

Figure 2F:
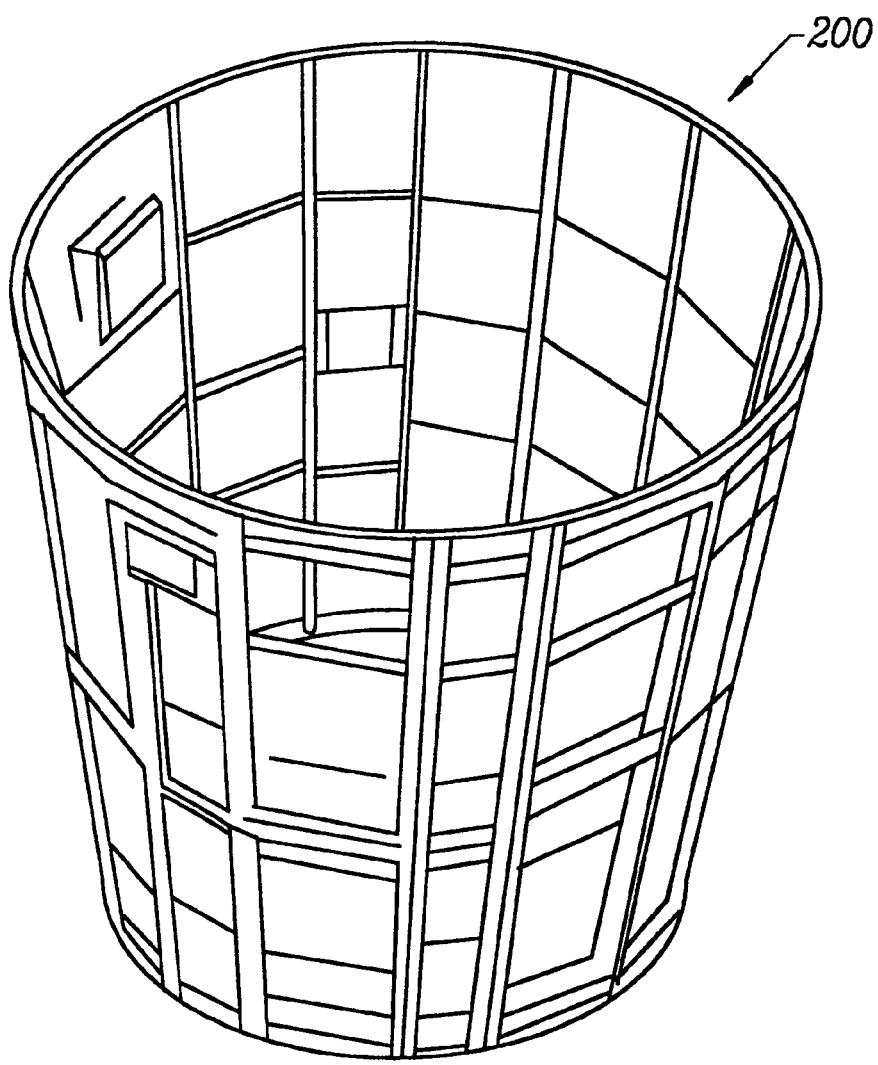

FIG. 2F is a simplified perspective diagram 200 of chamber liner, which is not in the chamber. The liner is often assembled outside of the chamber for manufacturing ease. The liner is then placed into the chamber. In particular, a chamber top is removed to expose the inner portion of the chamber. The chamber liner is lifted from an outside position, and is inserted into the chamber opening. Depending upon the application, the chamber liner can be fastened to the bottom of the chamber, as well as the top of the chamber by way of screws, snaps, and other fasteners. In one embodiment, the chamber liner can be removed from the chamber by removing the fasteners and lifting the liner out from the top portion of the chamber. A substrate in the liner can often become damaged or the like. Rather than replacing one of the silicon substrates in the chamber, the entire liner can be removed and reconditioned.

Although the above description have been generally described in terms of a silicon liner, it can be replaced by a variety of other materials. For example, the silicon liner can be replaced by quartz or other impurity free material. Depending upon the application, one of ordinary skill in the art would recognize other variations, modifications, and alternatives.

Figure 3:
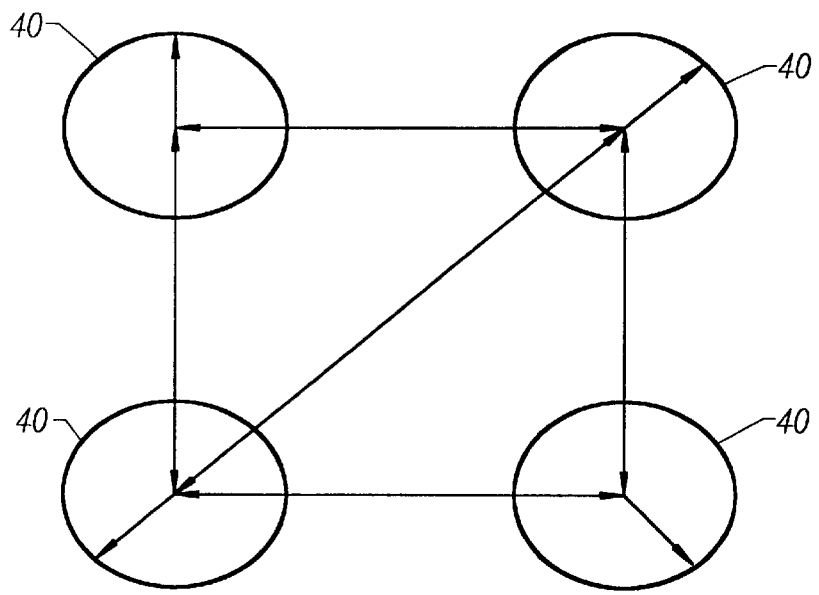

Referring to FIG. 3, the configuration of plasma sources 40 may be such that a plurality of physically smaller plasma sources 40 produce a uniform plasma over an area greater than that of sum of the areas of the individual sources. In the embodiment of the configuration shown, four-inch diameter plasma sources 40 spaced at the corners of a square at six inch centers produce a plasma substantially equivalent to that generated by a single twelve inch diameter source. Therefore, by providing a vacuum chamber 14 with a plurality of windows 26, the various configurations of plasma sources 40 may be formed to produce a uniform plasma of the shape and uniformity desired. Antennae such as those depicted do not result in rf interference between sources when properly shielded as shown.

Multiple rf plasma sources can excite electron cyclotron resonance in the presence of a multi-dipole surface magnetic field. Such a surface magnetic field would, for example, be approximately 1 KG at the pole face and would drop to a few Gauss at about 10 cm. from the pole face. In such a system, electron cyclotron resonance may be established, with the electron cyclotron resonance frequency (in Hz) being given by the expression $nu=2.8\times10^6$ (B) where B is the magnetic field strength in Gauss. Thus, if the fundamental electron cyclotron resonance frequency is 13.56 MHz (that is, the frequency supplied by the rf generator) the magnetic field required (as applied by the magnets) is 4.8 G, for resonance coupling to take place. Higher harmonics of the fundamental resonance frequency may be achieved by increasing the magnetic field proportionately. Thus for a second harmonic to be coupled, the magnetic field would have to be increased to 9.6 G. Such ECR coupling is most effective at lower pressures (P<1 mTorr). The use of the small rf plasma sources permit such magnets to be positioned so as to make electron cyclotron resonance possible.

Figure 4:
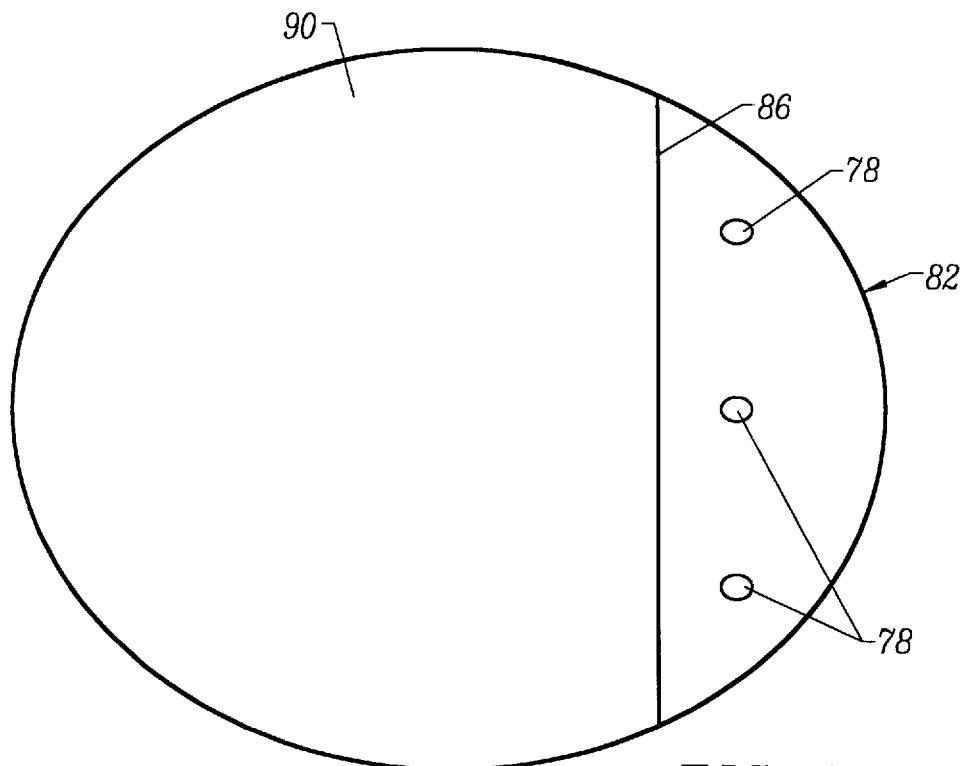
Figure 4A:
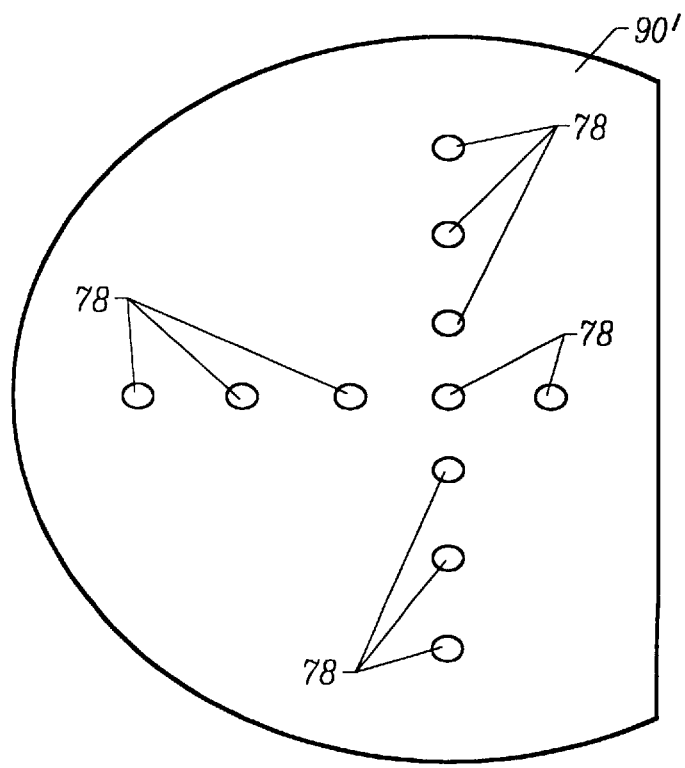

The Faraday cups 78 used to measure the uniformity of the field and the plasma dose, in one embodiment, are positioned near one edge in the surface of the wafer holder 82 (FIG. 4). The flat edge 86 of wafer 90 is positioned on the wafer holder 82 such that Faraday cups 78 of the wafer holder 82 are exposed to the plasma. In this way the plasma dose experienced by the wafer 90 can be directly measured. Alternatively, a special wafer 90', as shown in FIG. 4A, is fabricated with a plurality of Faraday cups 78 embedded in the wafer 90'. This special wafer 90' is used to set the rf generator 66 and the tuning capacitors 58 to achieve the desired plasma density and uniformity. Once the operating parameters have been determined, the special wafer 90' is removed and the wafers 90 to be processed placed on the wafer holder 82.

Figure 5:
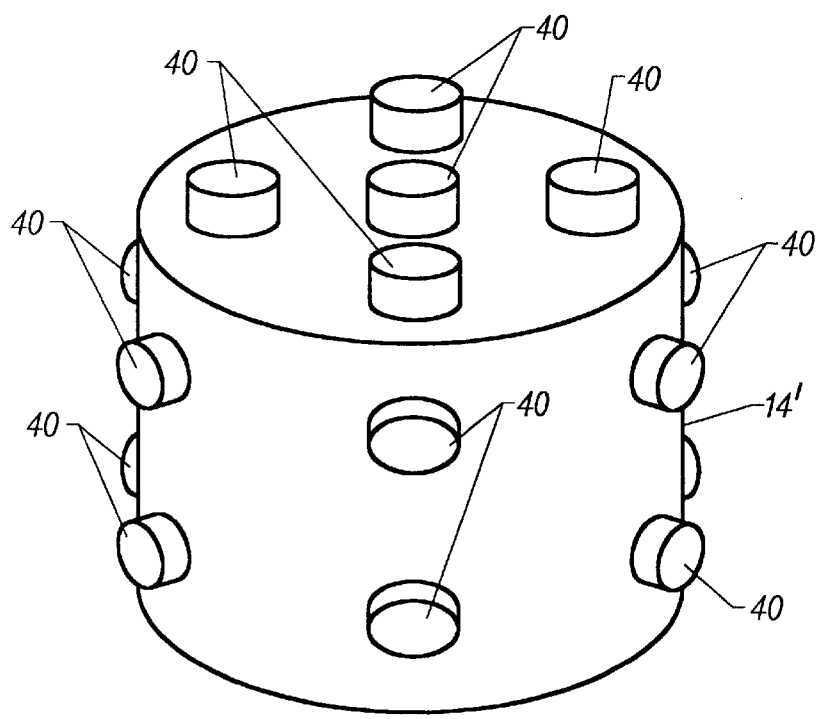

Referring to FIG. 5, although the system 200 has been described in terms of a planar array of plasma sources 40 located on the upper surface of the vacuum chamber 14, the plasma sources 40 may be distributed over other surfaces of the vacuum chamber 14' to generate a uniform volume of plasma. Such a system is particularly effective in batch processing.

Figure 6:
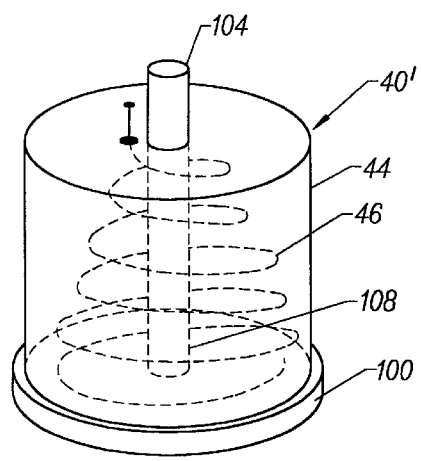
Figure 7:
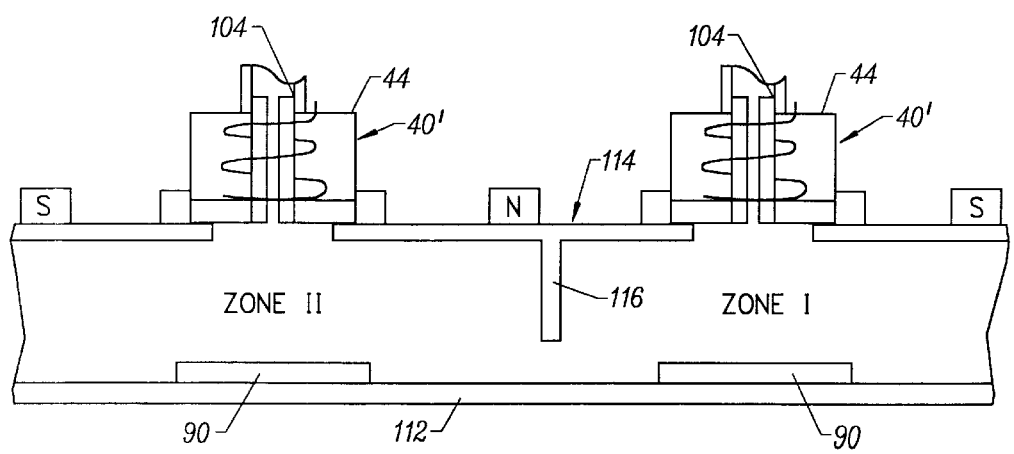

Referring to FIG. 6, in another embodiment, a quartz window 100 is not attached to the vacuum chamber 14, but instead encloses one end of the shield 44 of the plasma source 40'. In this embodiment, a tube 104 attached to an opening 108 in the quartz window 100 provides a gas feed to form a plasma of a specific gas. In this case, the plasma source 40' is not attached to a window 26 in the wall of the vacuum chamber 14, but is instead attached to the vacuum chamber 14 itself. Such plasma sources 40' can produce plasmas from specific gasses as are required by many processes. Several such plasma sources 40' can be aligned to sequentially treat a wafer 90 with different plasmas as in the embodiment of the in line system shown in FIG. 7. In this embodiment, wafers 90 are moved by a conveyor 112 through sequential zones, in this embodiment zones I and II, of a continuous processing line 114. Each zone is separated from the adjacent zones by a baffle 116. In one embodiment, the gas in zone I is $SiH_4$ used in Si-CVD processing, while the gas in zone II is $PH_3$ used in doping. In another embodiment, a cluster tool having load-locks to isolate each processing chamber from the other chambers, and equipped with a robot includes the rf plasma sources 40 of the invention for plasma CVD and plasma etching.

Figure 8:
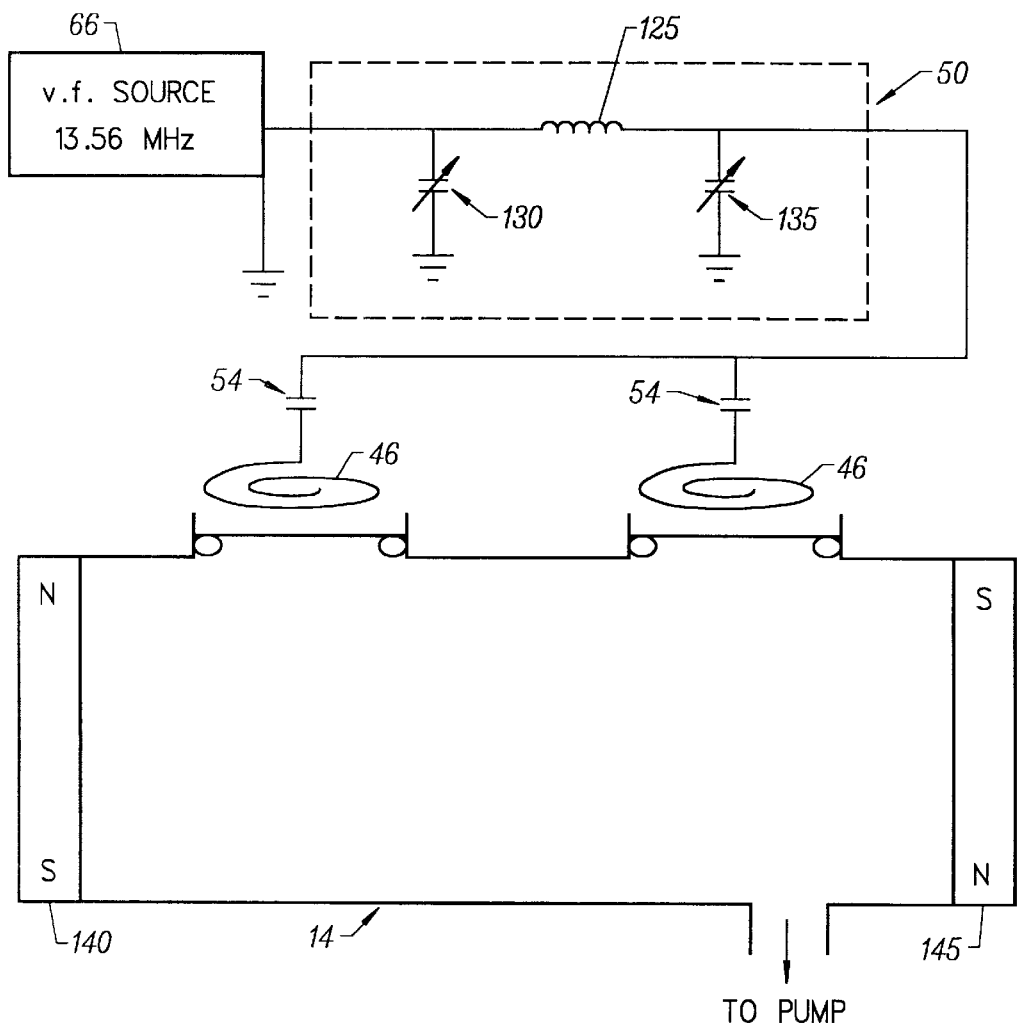

FIG. 8 depicts an embodiment of the system of the invention using two plasma sources. In this embodiment each source is an inductive pancake antenna 3–4 inches in diameter. Each antenna 46 is constructed of a ¼ inch copper tube and contains 5–6 turns. Each antenna 46 is connected to a matching network 50 through a respective 160 pf capacitor. The matching network 50 includes a 0.03 mu H inductor 125 and two variable capacitors 130, 135. One variable capacitor 130 is adjustable over the range of 10–250 pf and the second capacitor 135 is adjustable over the range of 5–120 pf. The matching network 50 is tuned by adjusting the variable capacitor 130, 135. The matching network 50 is in turn connected to an rf source 66 operating at 13.56 mHz. A series of magnets 140, 145 are positioned around the circumference of the chamber in alternating polarity every 7 cm to form a magnetic bucket.

With the chamber operating at 1 m Torr pressure, the power to the antenna 46 is 25 W per antenna or about 50 W total. With the pressure in the chamber reduced to 0.1 m Torr, the power is increased to 200 W per antenna or 400 W total. The resulting plasma at 50 W total power has a substantially uniform density of $10^{11}$ atoms/cm$^3$. The uniformity and the density may be further improved using four of such sources. With the chamber operating at 1 m Torr pressure, the power to the antenna 46 is 25 W per antenna or about 50 W total. With the pressure in the chamber reduced to 0.1 m Torr, the power is increased to 200 W per antenna or 400 W total. The resulting plasma at 50 W total power has a substantially uniform density of $10^{11}$ atoms/cm$^3$. The uniformity and the density may be further improved using four of such sources.

In a specific embodiment, the present invention operates at high temperature for light particle implanting processes. The light particle process can implant a variety of materials such as hydrogen, helium, quartz, and others. The light particles, which are implanted at high temperature, do not accumulate in any of the chamber materials, e.g., silicon, silicon liner. They tend to diffuse out of such materials, which prevents "pealing" of the silicon or silicon liner material. In most embodiments, implanting of a hydrogen bearing compound (e.g., $H_2$) occurs at about 400 and greater to about 500 Degrees Celsius. The high temperature operation generally does not allow any of the light particles to cause damage to the silicon or silicon liner material.

While the above description is generally described in a variety of specific embodiments, it will be recognized that the invention can be applied in numerous other ways. For example, the improved susceptor design can be combined with the embodiments of the other Figs. Additionally, the embodiments of the other Figs. can be combined with one or more of the other embodiments. The various embodiments can be further combined or even separated depending upon the application. Accordingly, the present invention has a much wider range of applicability than the specific embodiments described herein.

Although the above has been generally described in terms of a PIII system, the present invention can also be applied to a variety of other plasma systems. For example, the present invention can be applied to a plasma source ion implantation system. Alternatively, the present invention can be applied to almost any plasma system where ion bombardment of an exposed region of a pedestal occurs. Accordingly, the above description is merely an example and should not limit the scope of the claims herein. One of ordinary skill in the art would recognize other variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A plasma immersion ion implantation (PIII) treatment system for implantation, said system comprising:
   a chamber in which a plasma is generated in said chamber, said chamber having a bottom region exposed to the plasma and lined with silicon; and
   a silicon coated susceptor disposed in said chamber to support a silicon substrate, said silicon coated susceptor providing fewer non-silicon bearing impurities that can be sputtered off of the susceptor during an implantation process.

2. The system of claim 1 wherein said chamber comprises a plurality of substantially planar rf transparent windows on a surface of said chamber.

3. The system of claim 1 further comprising:
   an rf generator; and
   at least two rf sources, each external to said vacuum chamber and each said rf source electrically connected to said rf generator and juxtaposed to a respective one of said plurality rf transparent windows, and operative to generate said plasma in the vacuum chamber; said rf sources operative to produce a local, substantially uniform plasma proximate said substrate.

4. The system of claim 3 further comprising at least one tuning circuit, each said at least one tuning circuit electrically connected to one of said at least two rf sources.

5. The system of claim 1 wherein said silicon coated susceptor has a coating selected from polysilicon, amorphous silicon, or crystalline silicon.

6. The system of claim 5 wherein said silicon coated susceptor has a base metal selected from stainless steel or aluminum.

7. The system of claim 1 wherein said silicon substrate is a silicon bearing wafer.

8. The system of claim 1 wherein said chamber comprises a silicon coating defined on an interior region of said chamber, said silicon coating providing fewer non-silicon impurities onto said silicon substrate, said non-silicon impurities can be sputtered off of said chamber.

9. The system of claim 8 wherein said silicon coating is selected from amorphous silicon, polysilicon, or crystalline silicon.

10. The system of claim 8 wherein said chamber comprises an aluminum bearing material underlying said silicon coating.

11. The system of claim 1 wherein said system is provided in a cluster tool.

12. A method for forming a substrate, said method comprising steps of:

providing a substrate onto a silicon coated susceptor within a plasma immersion ion implantation chamber, said substrate comprising a silicon wafer with a surface, and said chamber having a bottom surface exposed to a plasma and lined with silicon;

introducing particles in a directional manner toward and through said surface of said substrate to uniformly place said ions into a selected depth across a plane of said substrate; and sputtering silicon bearing material off of said silicon coated susceptor, said silicon bearing material being attached to said surface of said substrate.

13. The method of claim 12 wherein said silicon coated susceptor comprises a material selected from an amorphous silicon, polysilicon, or crystalline silicon.

14. The method of claim 12 wherein said silicon coated susceptor comprises a base material selected from aluminum or stainless steel.

15. The method of claim 12 wherein said substrate comprises silicon wafer.

16. The method of claim 12 wherein said chamber comprises a silicon coating defined on interior surfaces of said chamber.

17. The method of claim 16 wherein said silicon coating is selected from amorphous silicon, polysilicon, or crystalline silicon.

18. The method of claim 12 wherein said method occurs in a cluster tool.

* * * * *